US007769061B2

(12) United States Patent  (10) Patent No.: US 7,769,061 B2
Kamijima  (45) Date of Patent: Aug. 3, 2010

(54) LASER LIGHT SOURCE DEVICE, ILLUMINATION APPARATUS, MONITOR, AND PROJECTOR

(75) Inventor: Shunji Kamijima, Hana-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/857,147

(22) Filed: Sep. 18, 2007

(65) Prior Publication Data

US 2008/0080572 A1    Apr. 3, 2008

(30) Foreign Application Priority Data

Sep. 29, 2006  (JP)  ............................ 2006-266965
Jul. 24, 2007  (JP)  ............................ 2007-192288

(51) Int. Cl.
    *H01S 3/10*  (2006.01)
(52) U.S. Cl. ........................ 372/22; 372/21; 372/50.12; 359/366
(58) Field of Classification Search .................. 372/22, 372/21, 50.12; 359/366
    See application file for complete search history.

(56) References Cited

U.S. PATENT DOCUMENTS

| | | | | |
|---|---|---|---|---|
| 4,637,026 | A | * | 1/1987 | Liu ............................... 372/22 |
| 5,191,591 | A | * | 3/1993 | Okamoto et al. ............. 372/101 |
| 5,251,060 | A | * | 10/1993 | Uenishi et al. ............... 359/328 |
| 5,303,247 | A | * | 4/1994 | Yamamoto et al. ............ 372/22 |
| 5,452,312 | A | * | 9/1995 | Yamamoto et al. .............. 372/5 |
| 5,583,882 | A | * | 12/1996 | Miyai et al. .................. 372/103 |
| 5,592,326 | A | | 1/1997 | Taira |
| 5,619,369 | A | * | 4/1997 | Yamamoto et al. ........... 359/332 |
| 5,675,593 | A | * | 10/1997 | Oka ............................. 372/21 |
| 5,917,660 | A | * | 6/1999 | Ohtaki ........................ 359/710 |
| 6,711,183 | B1 | * | 3/2004 | Mizuuchi et al. .............. 372/22 |
| 6,836,497 | B1 | * | 12/2004 | Hatori ..................... 372/43.01 |
| 7,309,168 | B2 | | 12/2007 | Momiuchi et al. |
| 2005/0063428 | A1 | * | 3/2005 | Anikitchev et al. ............. 372/9 |
| 2006/0023173 | A1 | | 2/2006 | Mooradian et al. |
| 2006/0023757 | A1 | | 2/2006 | Mooradian et al. |
| 2006/0268241 | A1 | | 11/2006 | Watson et al. |
| 2006/0280219 | A1 | | 12/2006 | Shchegrov |

(Continued)

FOREIGN PATENT DOCUMENTS

CN    1545172    11/2004

(Continued)

OTHER PUBLICATIONS

Mooradian, Aram et al., "High Power Extended Vertical Cavity Surface Emitting Diode Lasers and Arrays And Their Applications," Micro-Optics Conference, pp. 1-4, Nov. 2, 2005.

*Primary Examiner*—Minsun Harvey
*Assistant Examiner*—Yuanda Zhang
(74) *Attorney, Agent, or Firm*—Oliff & Berridge, PLC

(57) ABSTRACT

A laser light source device includes a laser light source that emits a laser beam as a fundamental wave and an optical wavelength conversion element that converts the fundamental wave into a second harmonic. An optical lens system including a first surface having positive power and a second surface having negative power is arranged between the laser light source and the optical wavelength conversion element. The first surface and the second surface are arranged in order from the laser light source side.

16 Claims, 10 Drawing Sheets

U.S. PATENT DOCUMENTS

| | | |
|---|---|---|
| 2007/0153862 A1 | 7/2007 | Shchegrov et al. |
| 2007/0153866 A1 | 7/2007 | Shchegrov et al. |

FOREIGN PATENT DOCUMENTS

| | | |
|---|---|---|
| JP | A 5-297428 | 11/1993 |
| JP | A-08-006081 | 1/1996 |
| JP | A-09-232665 | 9/1997 |
| JP | A-10-090620 | 4/1998 |
| JP | A-11-068210 | 3/1999 |
| JP | 11249183 A * | 9/1999 |
| JP | A-2006-173526 | 6/2006 |
| JP | A-2007-171676 | 7/2007 |

* cited by examiner

LASER LIGHT SOURCE DEVICE, ILLUMINATION APPARATUS, MONITOR, AND PROJECTOR

BACKGROUND

1. Technical Field

The present invention relates to a laser light source device including a laser light source that emits a laser beam and an illumination apparatus, a monitor, and a projector including the laser light source device.

2. Related Art

A second harmonic generation (SHG) technique for generating light having a wavelength half that of incident light is well known as a technique for wavelength conversion. It is possible to obtain a laser beam having a wavelength in a visible region using an easily available semiconductor laser, which oscillates in a far infrared region, by combining this SHG technique with a semiconductor laser technique.

An example of the technique obtained by combining the SHG technique with the semiconductor laser technique is disclosed in JP-A-5-297428. According to the technique, a laser beam emitted from a semiconductor laser is made incident on an SHG element by a lens and converted into a second harmonic. In JP-A-5-297428 and the like, a structure of the SHG element is contrived to improve conversion efficiency.

However, in the technique in the past, although it is possible to improve characteristics of the SHG element, sufficient improvement of the conversion efficiency cannot be expected in the SHG element because of reasons (A) and (B) below.

(A) The lens provided between the semiconductor laser and the SHG element is a so-called field lens for condensing light. In the lens of this type, a distance to the SHG element is equal to or larger than a certain degree (longer than a focal length), a light beam density of the incident light on the SHG element falls. Since conversion energy of an optical wavelength conversion element substantially depends on the light beam density of the incident light, when the light beam density of the incident light falls, highly efficient wavelength conversion cannot be performed.

(B) In the field lens, since a radiation angle of a light beam has a large tilt with respect to an optical axis, the laser beam diffuses to the outside of the SHG element. This makes it difficult to effectively secure the inside of the SHG element as an optical path. Therefore, highly efficient wavelength conversion cannot be performed.

SUMMARY

An advantage of some aspects of the invention is to improve conversion efficiency in an SHG element and make it possible to generate a laser beam with high power.

According to an aspect of the invention, there is provided a laser light source device including a laser light source that emits a laser beam as a fundamental wave and an optical wavelength conversion element that converts the fundamental wave into a second harmonic. An optical lens system including a first surface having positive power and a second surface having negative power is arranged between the laser light source and the optical wavelength conversion element. The first surface and the second surface are arranged in order from the laser light source side.

In the laser light source device, the laser beam from the laser light source is condensed by the positive power of the first surface of the optical lens system to improve a light beam density of the laser beam.

In the optical wavelength conversion element, when strong light such as the laser beam passes, the light causes a nonlinear optical effect. A phenomenon of the nonlinear optical effect is represented by the following Equation (1):

$$P = \epsilon_o \chi^{(1)} E + \epsilon_o \chi^{(2)} EE + \epsilon_o \chi^{(3)} EEE + \quad (1)$$

where P is polarization caused in a substance, E is the intensity of an electric field of incident light, $\epsilon_o$ is a dielectric constant in the vacuum, $\chi^{(1)}$, $\chi^{(2)}$, $\chi^{(3)}$, and the like are nonlinear susceptibilities represented by tensors of a second level, a third level, a fourth level, and the like. According to Equation (1), the polarization P is decided with the intensity E of the electric field of the incident light as a significant factor. Therefore, to improve efficiency of wavelength conversion, it is important to increase the light beam density of the laser beam made incident on the optical wavelength conversion element. Since the light beam density is improved by the first surface of the optical lens system as described above, the efficiency of wavelength conversion is improved.

A focal length of the laser beam, the light beam density of which is improved on the first surface, is extended by the negative power of the second surface on the next stage while the high light beam density is maintained. When the focal length is extended, a traveling angle of a light beam is close to an optical axis direction. As a result, since it is easy to effectively secure the inside of the optical wavelength conversion element as an optical path, the efficiency of wavelength conversion is further improved.

Therefore, in the laser light source device according to the aspect of the invention, it is possible to improve conversion efficiency in the optical wavelength conversion element with the two actions described above. As a result, it is possible to generate a laser beam at high power.

The laser light source may be a laser array in which plural light-emitting sections that emit light are arrayed. The laser array may be a surface-emitting laser array in which a resonating direction of light is perpendicular to a substrate surface.

The optical lens system may include an optical element of a meniscus shape, one side of which is formed in a convex surface as the first surface and an opposite side of which is formed in a concave surface as the second surface. With this structure, it is possible to easily constitute an optical lens system having both positive power and negative power using the optical element of the meniscus shape.

The optical element of the meniscus shape may be a cylindrical lens. Even if the laser light source is the laser array in which plural light-emitting sections are arrayed, when the optical element of the meniscus shape is the cylindrical lens, it is possible to easily manufacture the optical element of the meniscus shape.

It is preferable that a focus position of the optical element is present in the optical wavelength conversion element or at a further distance than the optical wavelength conversion element. With this structure, it is easier to effectively secure the inside of the optical wavelength conversion element as an optical path.

The optical lens system may include a convex lens including the convex surface as the first surface and a concave lens including the concave surface as the second surface. With this structure, it is possible to easily constitute an optical lens system having both positive power and negative power by combining plural optical elements.

According to another aspect of the invention, there is provided an illumination apparatus including the laser light source device. This illumination apparatus can obtain high power.

According to still another aspect of the invention, there is provided a monitor including the laser light source device and an imaging unit which images a subject that is illuminated by the laser light source device.

This monitor can illuminate the subject with the high-power laser light source device. Thus, it is possible to improve brightness of an image imaged by the imaging unit.

According to still another aspect of the invention, there is provided a projector including the laser light source device and an image forming apparatus that displays an image corresponding to an image signal on a display surface using light from the laser light source device.

In this projector, the high-power laser light source device can be used. Thus, it is possible to display a high-intensity image.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be hereinafter explained with reference to the accompanying drawings.

1. First Embodiment

A. Structure of an Entire Apparatus

Figure 1:
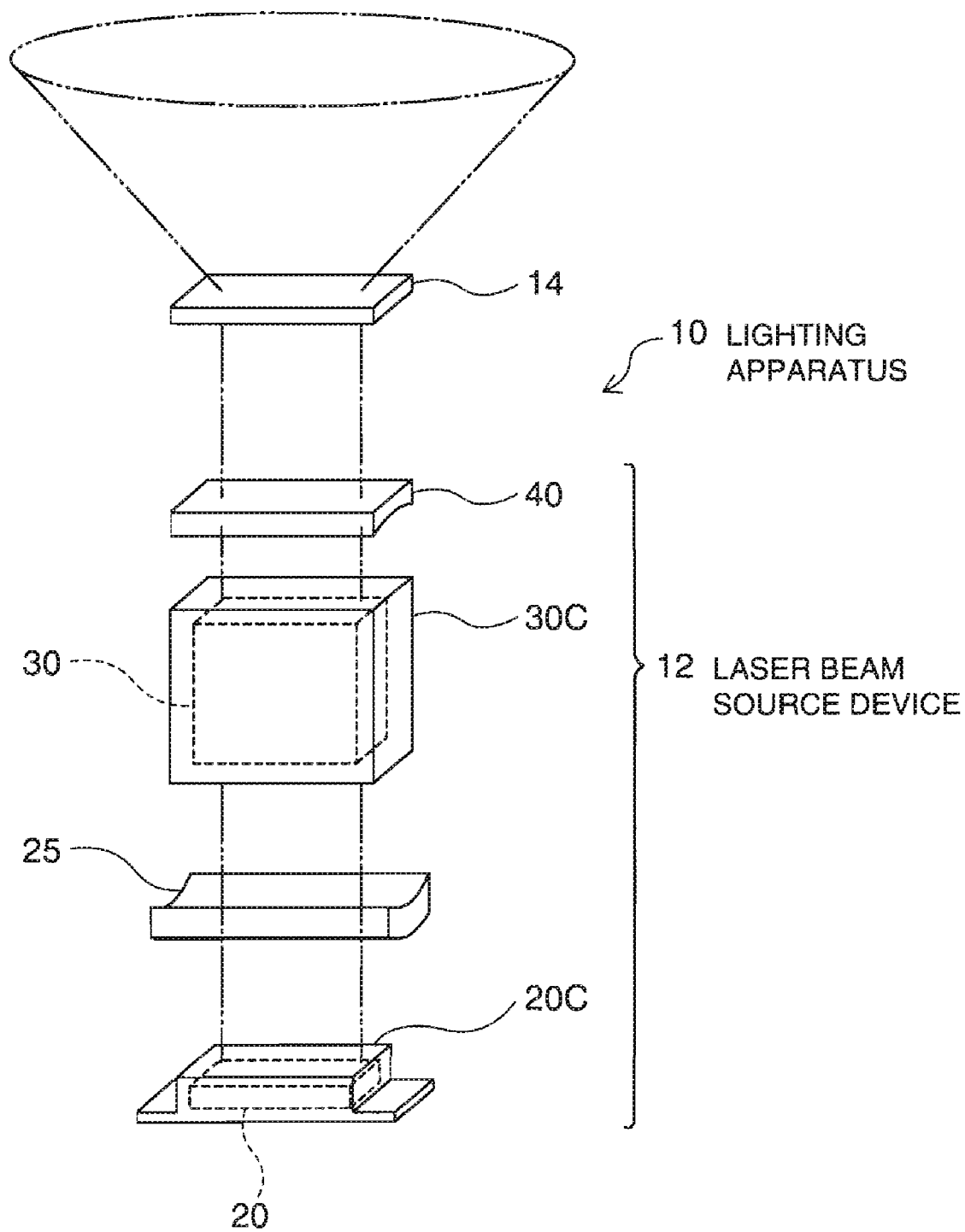
FIG. 1 is a schematic diagram of an illumination apparatus 10 according to a first embodiment of the invention.

FIG. 1 is a schematic diagram of an illumination apparatus 10 according to a first embodiment of the invention. As shown in the figure, the illumination apparatus 10 includes a laser light source device 12 equivalent to a "laser light source device" of the invention and a diffusing element 14 that diffuses a laser beam emitted from the laser light source device 12.

The laser light source device 12 includes a laser cell 20C incorporating a semiconductor laser array 20, a cylindrical lens 25 of a meniscus shape, a jacket 30C incorporating an optical wavelength conversion element 30, and a reflection mirror 40 functioning as an external optical resonator. The jacket 30C includes a Peltier element for temperature control together with a thermistor to make it possible to highly accurately control the temperature of the optical wavelength conversion element 30. Other heat generating means can be used instead of the Peltier element.

B. Structure of a Main Part

Figure 2:
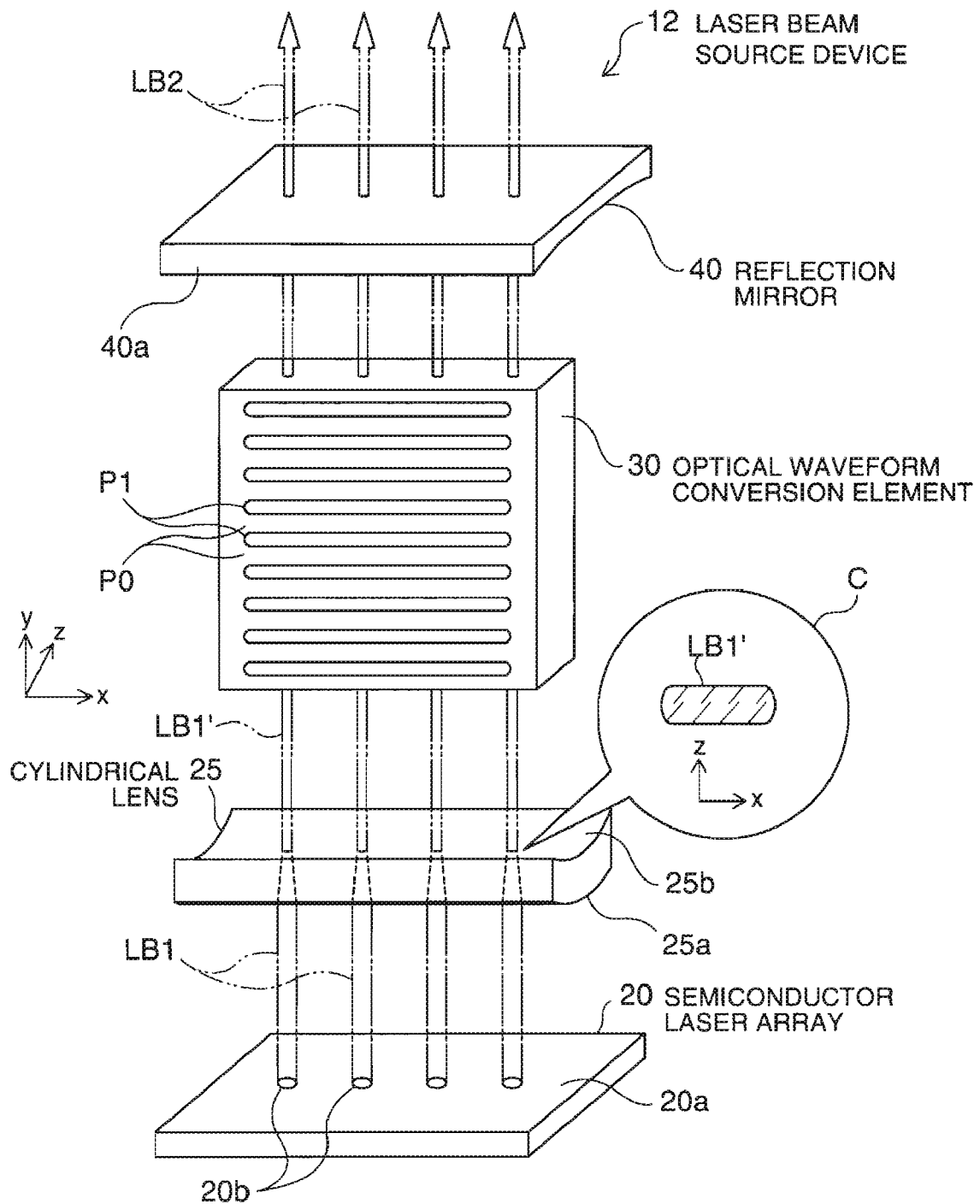
FIG. 2 is an explanatory diagram showing a main part of a laser light source device 12.

FIG. 2 is an explanatory diagram showing a main part of the laser light source device 12. The laser light source device 12 includes, as described above, the semiconductor laser array 20, the cylindrical lens 25, the optical wavelength conversion element 30, and the reflection mirror 40. The semiconductor laser array 20 is a semiconductor laser array called VCSEL (Vertical-Cavity Surface-Emitting Laser) in which a resonating direction of light is perpendicular to a substrate surface 20$a$ and a laser beam is emitted perpendicularly to the substrate surface 20$a$. The semiconductor laser array 20 has a one-dimensional array structure in which plural light-emitting layers (active layers) 20$b$ are arranged in one row. The number of the light-emitting layers 20$b$ is four in an example shown in the figure. However, the number of the light-emitting layers 20$b$ does not have to be limited to four and may be other numbers.

In the figure, coordinate axes (an x axis, a y axis, and a z axis) with an array direction of this array structure, i.e., a direction of the arrangement of the light-emitting layers 20$b$ set as an x axis direction, a direction of emission of laser beams LB1 from the light-emitting layers 20$b$ set as a y axis direction, and a direction perpendicular to both the directions set as a z axis direction are decided. The coordinate axes are used for explanation when necessary. In the laser light source device 12, the semiconductor laser array 20, the cylindrical lens 25, the optical wavelength conversion element 30, and the reflection mirror 40 are provided in the y axis direction in this order.

The cylindrical lens 25 is a cylindrical lens of the meniscus shape as described above. A general cylindrical lens has a shape obtained by cutting a cylinder into two in an axial direction. However, in this embodiment, a cut portion is formed in a concave surface to be formed in the meniscus shape. In other words, the cylindrical lens 25 in this embodiment is the meniscus shape, one side of which is the convex surface 25$a$ having the positive power and the opposite side is a concave surface 25$b$ having the negative power. This cylindrical lens 25 of the meniscus shape is arranged to place the convex surface 25$a$ on the semiconductor laser array 20 side and place the concave surface 25$b$ on the optical wavelength conversion element 30 side.

In this embodiment, the convex surface 25$a$ has a curvature larger than that of the concave surface 25$b$ (has a curvature radius smaller than that of the concave surface 25$b$). The cylindrical lens 25 as a whole has a convex characteristic. In this case, it is possible to form a high energy density area by setting a focus position near and setting a condensing spot small. Alternatively, curvatures of the concave surface 25$b$ and the convex surface 25$a$ may be the same. In this case, it is possible to reduce a light beam diameter without changing the focus position. Moreover, it is also possible to set the curvature of the concave surface 25$b$ larger than that of the convex surface 25$a$ (the curvature radius of the concave surface 25$b$ smaller than that of the convex surface 25a) and change the characteristic of the cylindrical lens 25 as a whole into a concave characteristic. In this case, since a focal length can be extended, it is possible to extend the length of the optical wavelength conversion element.

Figure 3:
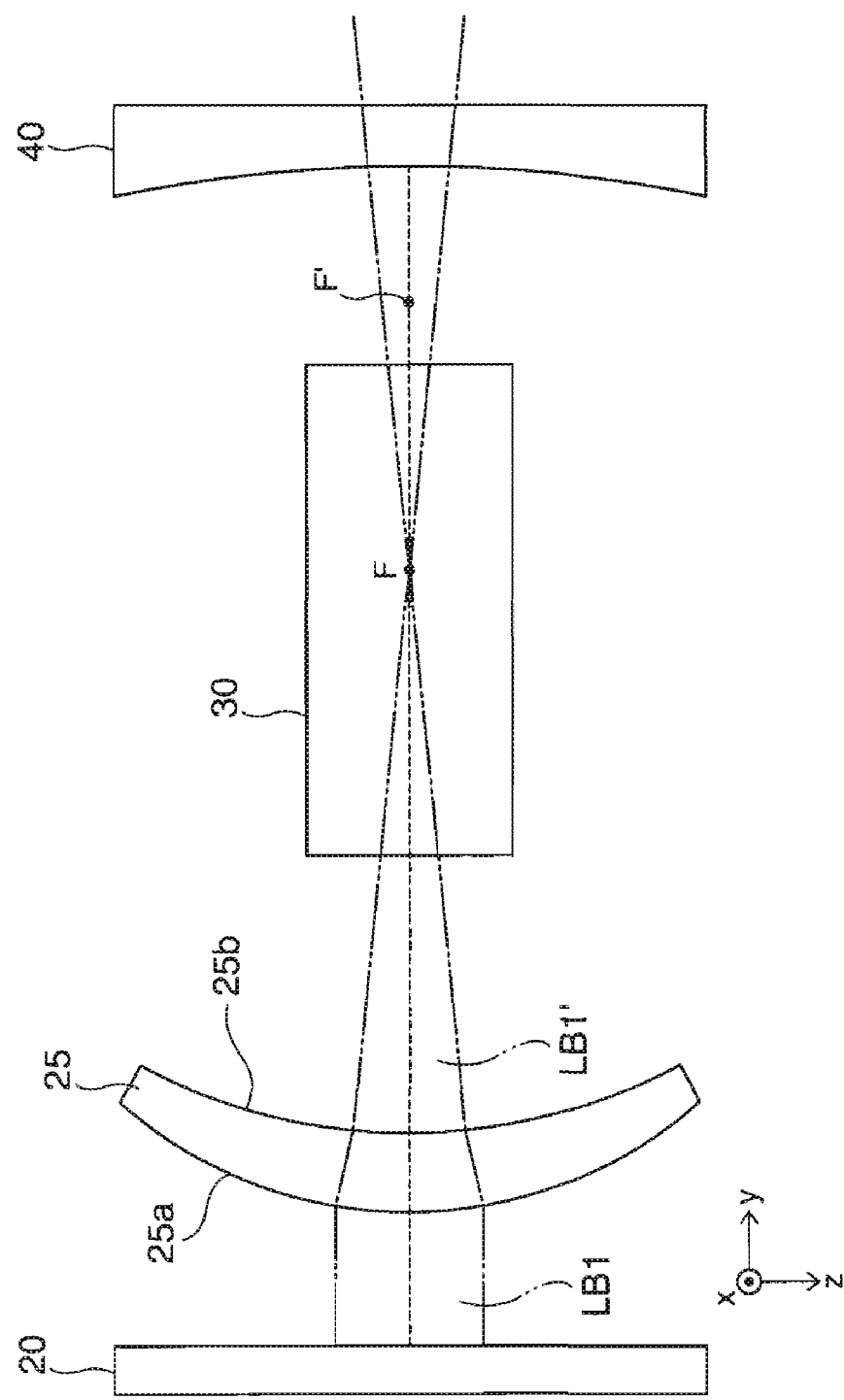
FIG. 3 is an explanatory diagram showing the action of a cylindrical lens 25 of a meniscus shape.

FIG. 3 is an explanatory diagram showing the action of the cylindrical lens 25 of the meniscus shape. In the figure, the cylindrical lens 25 in FIG. 2 is viewed in an −x direction. As shown in FIG. 3, a laser beam LB1 emitted from the semiconductor laser array 20 and made incident on the cylindrical lens 25 is condensed on the convex surface 25a. While a light beam diameter of the laser beam LB1 is reduced (a light beam energy density is increased) because of the condensing on the convex surface 25a, a focal length of the laser beam LB1 is extended on the concave surface 25b compared with a focus position under condenser lens power on the convex surface 25a. The laser beam LB1 is emitted as a laser beam LB1'. The condensing on the convex surface 25a reduces a light beam width in a z axis direction in the figure. The light beam width does not change in an x axis direction. This is because the concave surface 25b extends straight in the x axis direction and curves in the z axis direction. The cylindrical lens used here has the power of the convex surface 25a larger than the power of the concave surface 25b in the z axis direction. Therefore, the cylindrical lens has the action for condensing a parallel light beam.

An emission section of the laser beam LB1 on the concave surface 25b is shown in a circle C of a balloon in FIG. 2. It is also seen from this emission section that, in the cylindrical lens 25, a laser beam is condensed in the z axis direction and does not change in the z axis direction.

The optical wavelength conversion element 30 is an element that causes a phenomenon of second harmonic generation (SHG), i.e., a secondary nonlinear optical phenomenon in which two photons are converted into one photon having a frequency twice as high as that of each of the two photons. In the optical wavelength conversion element 30, a polarization inversion structure is formed in a ferrodielectric material. In the polarization inversion structure, polarization inversion areas P1 in which a direction of spontaneous polarization inherent in ferrodielectric optical crystal is inverted and polarization noninversion areas P0 in which the direction is not inverted are alternately formed. A direction in which the polarization inversion areas P1 and the polarization noninversion areas P0 are alternately arranged coincides with the y axis direction, i.e., a direction of emission of the laser beams LB1 by the semiconductor laser array 20.

The polarization inversion structure is formed by an electric field application method in an element in which lithium niobate or lithium tantalum is used. A method of forming the polarization inversion structure does not have to be limited to this method. The polarization inversion structure may be formed by other methods such as a polarization inversion method by ion exchange and a micro-domain inversion method by an electron beam. A material of the element does not have to be limited to lithium niobate and lithium tantalum. An appropriate material in each of the methods only has to be used.

In the reflection mirror 40, special coating is applied to a surface 40a having a shape of a reflection surface corresponding to an angle of incidence of the laser beams LB1' on the optical wavelength conversion element 30 side. This special coating makes the surface 40a highly reflective with respect to excitation light emitted from the semiconductor laser array 20 and highly transmissive with respect to a second harmonic emitted from the optical wavelength conversion element 30. On the other hand, special coating that makes the substrate surface 20a on an emission side of the semiconductor laser array 20 highly transmissive with respect to the excitation light and highly reflective with respect to the second harmonic is applied to the substrate surface 20a. With such a structure, an optical resonator is constituted between the substrate surface 20a of the semiconductor laser array 20 and the surface 40a of the reflection mirror 40. A laser beam emitted from the semiconductor laser array 20 is confined in this optical resonator and transmitted through the optical wavelength conversion element 30 many times. Since the optical wavelength conversion element 30 is highly accurately subjected to temperature control by the Peltier element as described above, a second harmonic with little noise can be obtained. The second harmonic is transmitted through the reflection mirror 40 and emitted from the laser light source device 12 as wavelength-converted laser beams LB2.

Referring back to FIG. 3, as described above, the cylindrical lens 25 of the meniscus shape has the action of extending the focal length with the concave surface 25b. However, in this embodiment, as shown in the figure, a focal point F of the cylindrical lens 25 is optically designed to be located in the optical wavelength conversion element 30. The focal point F may be present in any position in the optical wavelength conversion element 30 in the y axis direction or may be present any position at a further distance than the optical wavelength conversion element 30, i.e., further on the reflection mirror 40 side than the optical wavelength conversion element 30 (e.g., a position F' in the figure).

C. Action and Effect

In the laser light source device 12 included in the illumination apparatus 10 constituted as described above, the laser beams LB1 from the semiconductor laser array 20 are condensed by the positive power of the convex surface 25a of the cylindrical lens 25 to improve the light beam density of the laser beam LB1. When the light beam density is improved, the polarization P is increased according to Equation (1) and the efficiency of wavelength conversion is improved. A focal length of the laser beam with the light beam density improved is extended by negative power of the concave surface 25b of the cylindrical lens 25 while the high light beam density is maintained. When the focal length is extended, a traveling angle of the light beam is close to an optical axis direction. As a result, it is easy to effectively secure the inside of the optical wavelength conversion element 30 as an optical path. Therefore, the efficiency of wavelength conversion is further improved. Moreover, since the light beam density is improved in the nonlinear optical element, efficiency of conversion to a second harmonic is improved. Therefore, it is possible to improve the wavelength conversion efficiency. When the positive power is set larger than the negative power, there is action for condensing a light beam more in front. Therefore, it is possible to improve the light beam density in the nonlinear optical element and highly efficiently realize conversion of the second harmonic.

Therefore, in the laser light source device 12 according to this embodiment, it is possible to improve the conversion efficiency in the optical wavelength conversion element 30 with the two actions described above. As a result, it is possible to generate a laser beam at high power. Consequently, the illumination apparatus 10 can obtain high power.

When an optical lens system is designed to provide one section of the meniscus shape in each of the plural light-emitting sections of the semiconductor laser array 20, the optical lens system is complicated. However, it is possible easily manufacture an optical lens system having both positive power and negative power by forming the cylindrical lens 25 in the meniscus shape as in this embodiment.

In this embodiment, as explained above with reference to FIG. 3, the focal point F of the cylindrical lens 25 is decided to be located in the optical wavelength conversion element 30. Therefore, it is easier to effectively secure the inside of the optical wavelength conversion element 30 as an optical path.

When the focal length is extended as described above, a traveling angle of the laser beams LB1 are close to the optical axis direction (the y axis direction). However, this allows the laser beams LB1' to uniformly pass through the polarization inversion structure formed in the optical wavelength conversion element 30. Reasons for this are explained in detail below.

Figure 4:
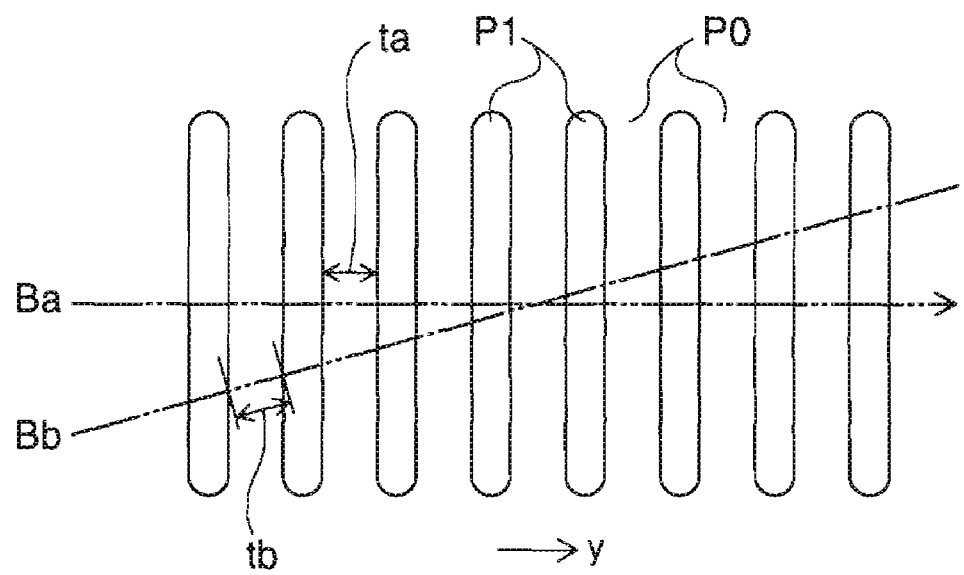
FIG. 4 is an explanatory diagram showing a state in which two light beams Ba and Bb traveling in different directions pass through a polarization inversion structure.

FIG. 4 is an explanatory diagram showing a state in which two light beams Ba and Bb traveling in different directions pass through the polarization inversion structure. The polarization inversion structure is a structure in which the polarization inversion areas P1 and the polarization noninversion areas P0 are alternately arranged. In the case of the light beam Ba, the traveling direction of which coincides with the direction of the arrangement (a y direction), a distance between the polarization inversion area P1 and the polarization inversion area P1 (hereinafter referred to as "pitch") ta has a fixed size and is small on an optical path of the light beam Ba. On the other hand, in the case of the light beam Bb, the traveling direction of which substantially tilts from the y axis direction, a pitch tb substantially changes depending on a position and is larger than the pitch ta on an optical path of the light beam Bb. Therefore, the traveling angle of the laser beams LB1' is closer to the optical axis direction (the y axis direction), i.e., closer to a parallel light beam, the laser beams LB1' pass through the polarization inversion structure at a fixed pitch and a small pitch. Therefore, the conversion efficiency in the optical wavelength conversion element 30 is further improved.

D: Modifications

Modifications of the first embodiment are explained below.

Figure 5:
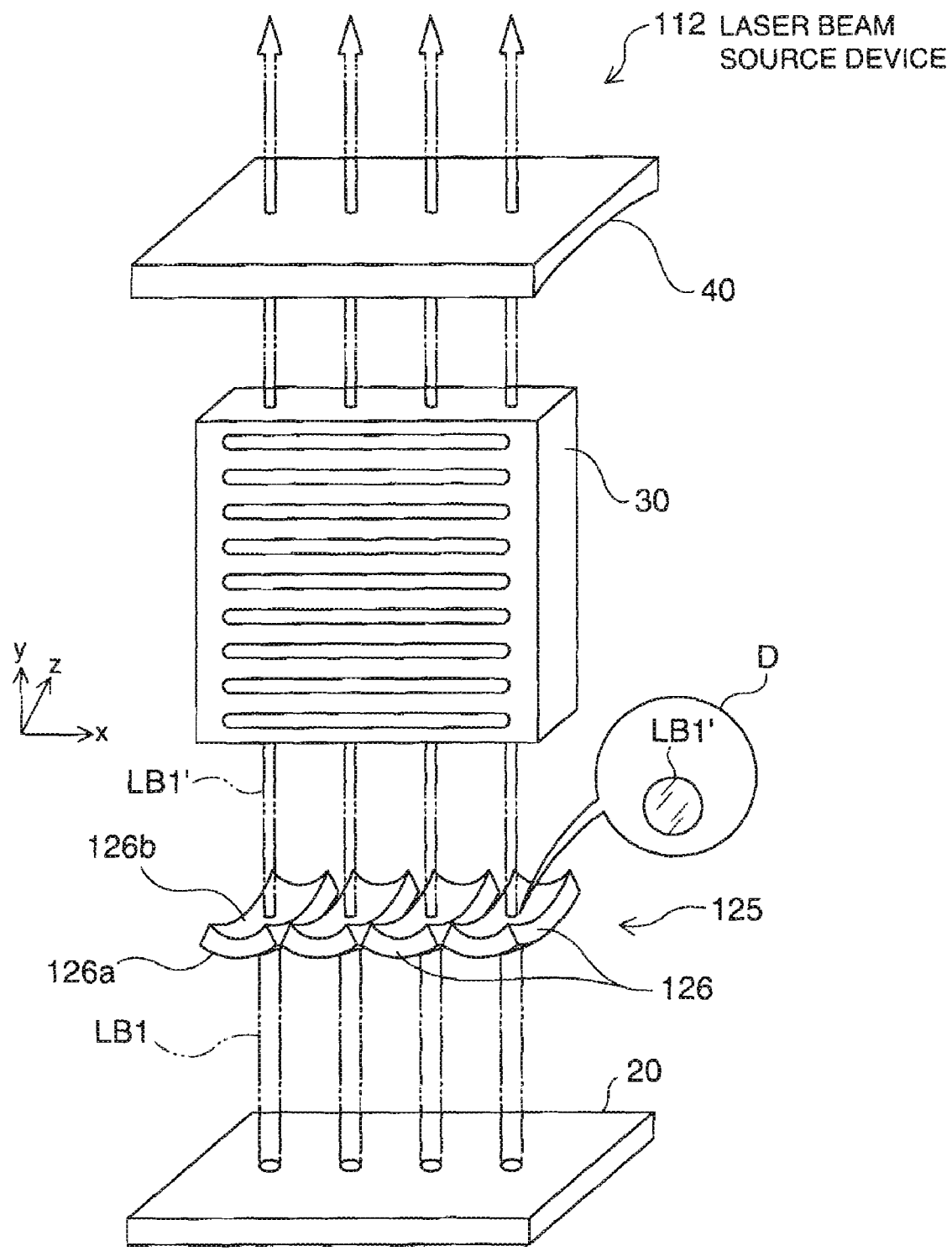
FIG. 5 is an explanatory diagram showing a main part of a laser light source device 112 according to a first modification of the first embodiment.

FIG. 5 is an explanatory diagram showing a main part of a laser light source device 112 provided in an illumination apparatus according to a first modification. The laser light source device 112 can be used as an illumination apparatus as in the first embodiment. As shown in the figure, the laser light source device 112 includes the semiconductor laser array 20, a meniscus lens array 125, the optical wavelength conversion element 30, and the reflection mirror 40. The semiconductor laser array 20, the optical wavelength conversion element 30, and the reflection mirror 40 are identical with those in the first embodiment and denoted by the identical reference numerals in this modification.

In the meniscus lens array 125, meniscus lenses 126 are arrayed by the number of the light-emitting layers 20b of the semiconductor laser array 20. An array direction of the meniscus lenses 126 coincides with the array direction (the x direction) of the light-emitting layer 20b in the semiconductor laser array 20. The laser beam LB1 emitted from each of the plural light-emitting layers 20b of the semiconductor laser array 20 is made incident on each of the plural meniscus lenses 126.

In the meniscus lenses 126, one sides are convex surfaces 126a having positive power and the opposite surfaces are concave surfaces 126b having negative power. The convex surfaces 126a are arranged on the semiconductor laser array 20 side and the concave surfaces 126b are arranged on the optical wavelength conversion element 30 side. The cylindrical lens 25 of the meniscus shape in the first embodiment is curved only in the z axis direction on the x-z plane. On the other hand, the meniscus lenses 126 in the first modification are curved in both the x axis direction and the z axis direction on the x-z plane. Therefore, as shown in a circle D of a balloon, an emission section of the laser beam LB1' from each of the meniscus lenses 126 is circular. A diameter of this emission section is smaller than that of the laser beam LB1 made incident on the meniscus lens 126.

The meniscus lenses 126 act to condense the laser beams LB1 sent from the semiconductor laser array 20 on the convex surfaces 126a and extend a focal length on the concave surfaces 126b. As in the first embodiment, focal points of the meniscus lenses 126 are optically designed to be located in the optical wavelength conversion element 30 in the y axis direction or at a further distance than the optical wavelength conversion element 30, i.e., further on the reflection mirror 40 side than the optical wavelength conversion element 30. When curvatures of a convex surface and a concave surface of a meniscus lens are identical, since only a beam diameter is reduced without changing a focal length, it is possible to improve an energy density.

In the laser light source device 112 according to the first modification constituted as described above, the laser beams LB1 from the semiconductor laser array 20 are condensed by the positive power of the convex surfaces 126a of the meniscus lenses 126 and a focal length of the laser beams LB1 is extended by the negative power of the concave surfaces 126b. Therefore, as in the laser beam source device 12 according to the first embodiment, it is possible to improve the conversion efficiency in the optical wavelength conversion element 30. As a result, there is an effect that it is possible to generate a laser beam at high power.

Figure 6:
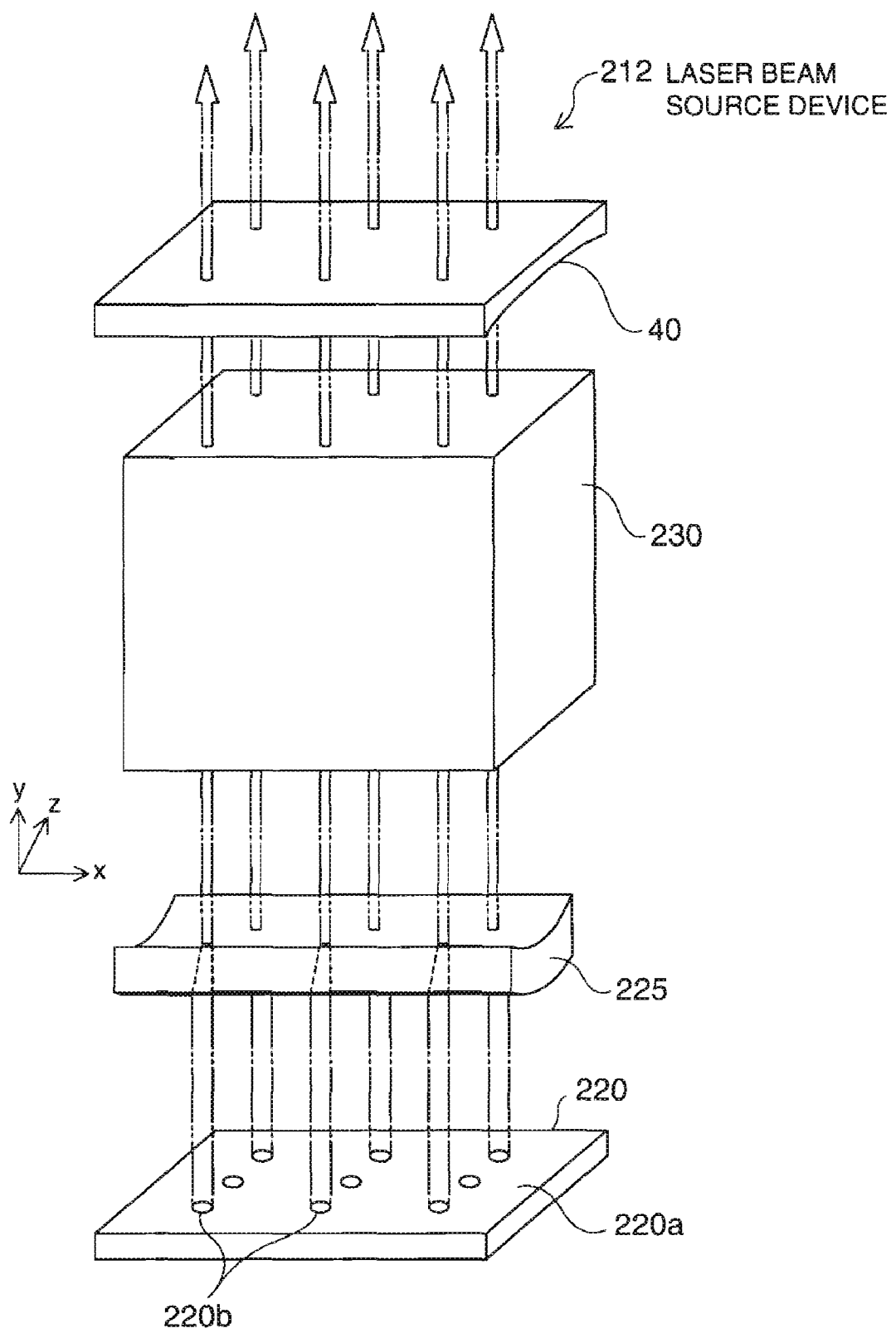
FIG. 6 is an explanatory diagram showing a main part of a laser light source device 212 according to a second modification of the first embodiment.

FIG. 6 is an explanatory diagram showing a main part of a laser light source device 212 included in an illumination apparatus according to a second modification of the first embodiment. The laser light source device 212 can be used as an illumination apparatus as in the first embodiment. As shown in the figure, the laser light source device 212 includes a semiconductor laser array 220, a cylindrical lens 225 of the meniscus shape, an optical wavelength conversion element 230, and the reflection mirror 40. The reflection mirror 40 is identical with that in the first embodiment.

The semiconductor laser array 220 is different from the semiconductor laser array 20 in the first embodiment only in that light-emitting layers 220b have a two-dimensional array structure in which the light-emitting layers 220b are arranged in three rows. The semiconductor laser array 220 is the same as the semiconductor laser array 20, for example, in that the semiconductor laser array 220 is the VCSEL and in a direction of emission of the laser beams LB1. In the semiconductor laser array 220, three light-emitting layers 220b are arranged in the x axis direction at equal intervals and three rows formed by this arrangement are arranged in the z axis direction. In the figure, laser beams from the light-emitting layers 220b on the second row are not shown. However, this is for the purpose of preventing the illustration from becoming complicated and unclear. Actually, laser beams are emitted from all nine light-emitting layers 220b.

The cylindrical lens 225 and the optical wavelength conversion element 230 are the same as the cylindrical lens 25 and the optical wavelength conversion element 130 except that sizes thereof in the z axis direction are large.

In the laser light source device 212 according to the second modification constituted as described above, although the semiconductor laser array 220 is a two-dimensional semiconductor laser array, the laser beams LB1 from the semiconductor laser array 220 can be condensed by positive power of a convex surface 225a of the cylindrical lens 225 and an area with a high energy density can be extended by negative power of a concave surface 225b. In this case, it is possible to arrange a waveform conversion element in the long area with the high energy density. As in the first embodiment, it is possible to increase wavelength conversion power in the optical wavelength conversion element 230. As a result, it is possible to generate a laser beam at high power.

In the semiconductor laser array 220, the rows of the two-dimensional array structure may be changed to other plural rows such as two rows and four rows other than three rows. The number of the light-emitting layers 220b arrayed in one row may be changed to other numbers instead of three.

Figure 7:
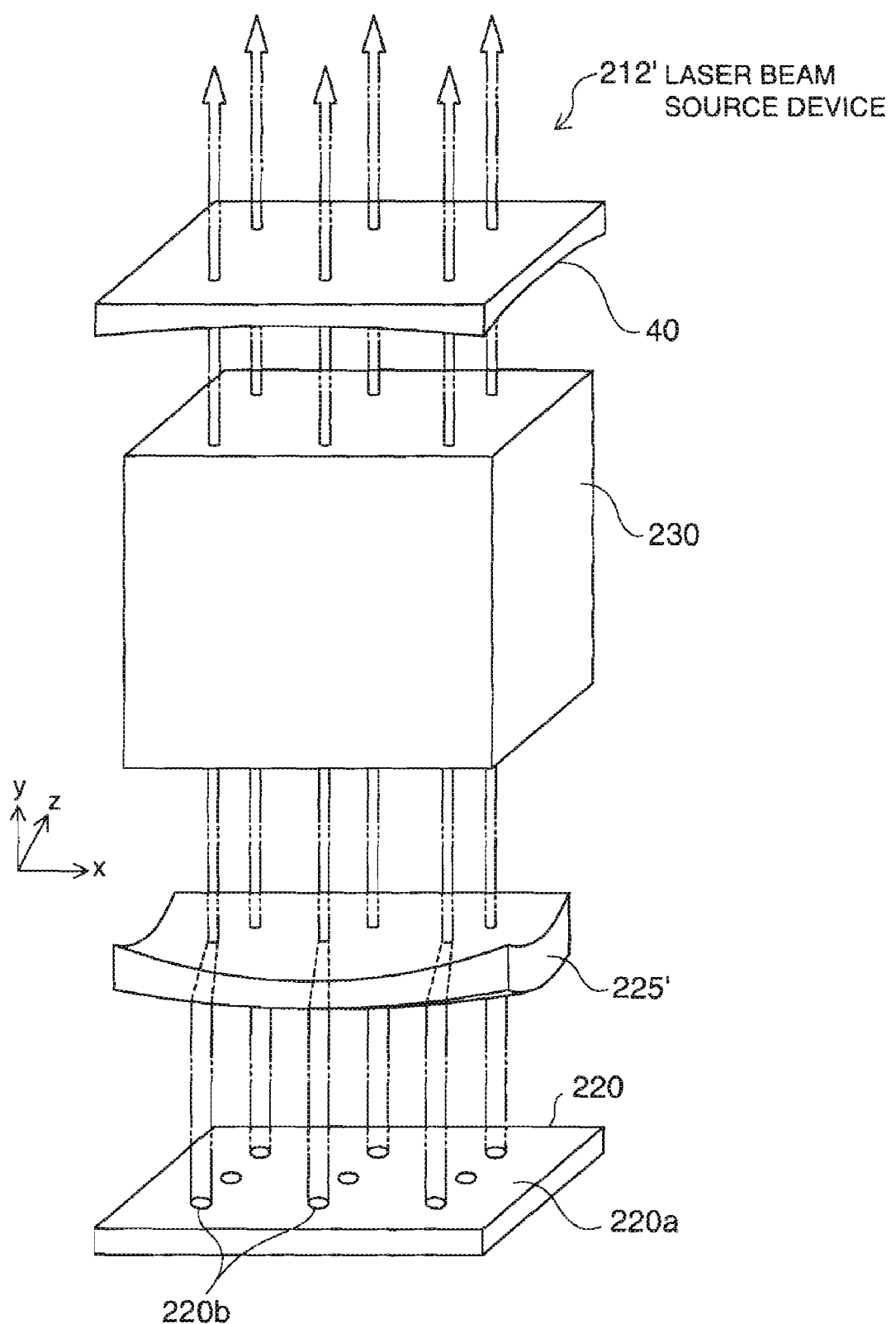
FIG. 7 is an explanatory diagram showing a main part of a laser light source device 212' according to a further modification of the second modification.

In the second modification, the cylindrical lens 225 is curved only in the z axis direction on the x-z plane. However, as a further modification of the second modification, as shown in FIG. 7, a cylindrical lens 225' may be curved both in the x axis direction and the z axis direction on the x-z plane. In the cylindrical lens 225 in the second modification, light emitted from the three light-emitting layers 220b in a front-most row in FIG. 6 (a row in a front-most position in the figure in the z axis direction) slightly shifts to the inner side (to the rear in the figure) in the z axis direction. Light emitted from the three light-emitting layers 220b in a rear-most row (a row in a rear-most position in the figure in the z axis direction) slightly shifts to the inner side (to the front in the figure) in the z axis direction. On the other hand, in the cylindrical lens 225' in this further modification, light emitted from the eight light-emitting layers 220b excluding the light-emitting layer 220b in the middle of the nine (3×3) light-emitting layers 220b slightly shifts to the inner side in both the z axis direction and the x axis direction. In the further modification, as in the first embodiment and the second modification, it is possible to improve the conversion efficiency in the optical wavelength conversion element 230. As a result, it is possible to generate a laser beam at high power.

Figure 8:
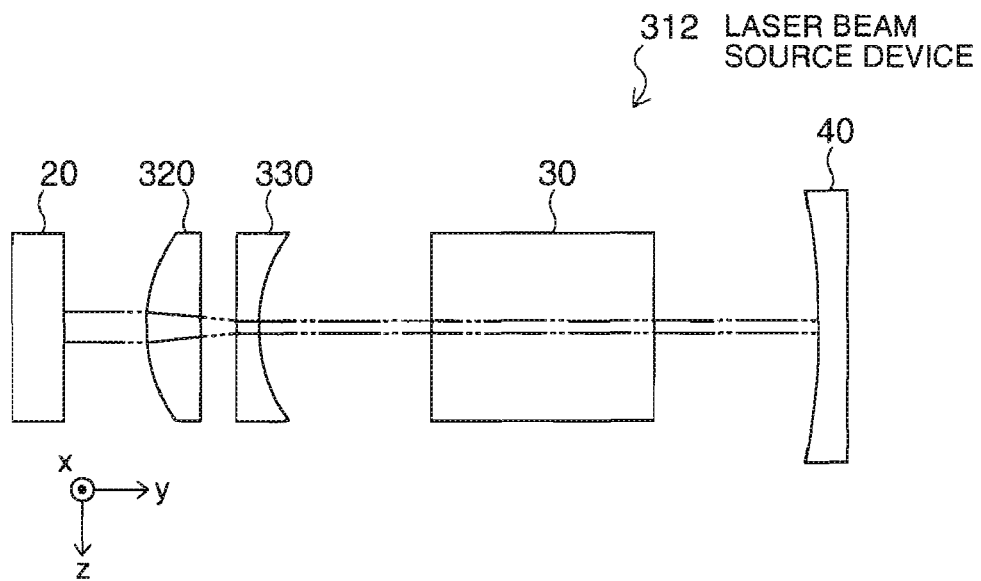
FIG. 8 is an explanatory diagram showing a main part of a laser light source device 312 according to a third modification of the first embodiment.

FIG. 8 is an explanatory diagram showing a main part of a laser light source device 312 included in an illumination apparatus according to a third modification of the first embodiment. The laser light source device 312 can be used as an illumination apparatus as in the first embodiment. The laser light source device 312 is the same as the laser light source device 12 according to the first embodiment except that a convex lens 320 and a concave lens 330 are provided instead of the cylindrical lens 25. Components identical with those in the first embodiment are denoted by the identical reference numerals.

In the first embodiment and the first and second modifications of the first embodiment, the optical lens system including the first surface having the positive power and the second surface having the negative power is constituted by one optical element. However, in this third modification, the optical lens system is constituted by a combination of plural optical elements. In other words, in the third modification, the optical lens system is constituted by the convex lens 320 having positive power and the concave lens 330 having negative power.

As in the first embodiment, a focal point of the concave lens 330 is optically designed to be located in the optical wavelength conversion element 30 in the y axis direction or at a further distance than the optical wavelength conversion element 30, i.e., further on the reflection mirror 40 side than the optical wavelength conversion element 30.

In the laser light source device 312 having the structure described above, it is possible to condense the laser beams LB1 from the semiconductor laser array 220 with the positive power of the convex lens 320 and extend a focal length with the negative power of the concave lens 330. Therefore, as in the first embodiment, it is possible to improve the conversion efficiency in the optical wavelength conversion element 30. As a result, it is possible to generate a laser beam at high power.

In the third modification, the convex lens 320 is a flat convex lens, one side of which is a plane. However, the convex lens 320 may be a double convex lens formed by combining two concave surfaces.

2. Second Embodiment

Figure 9:
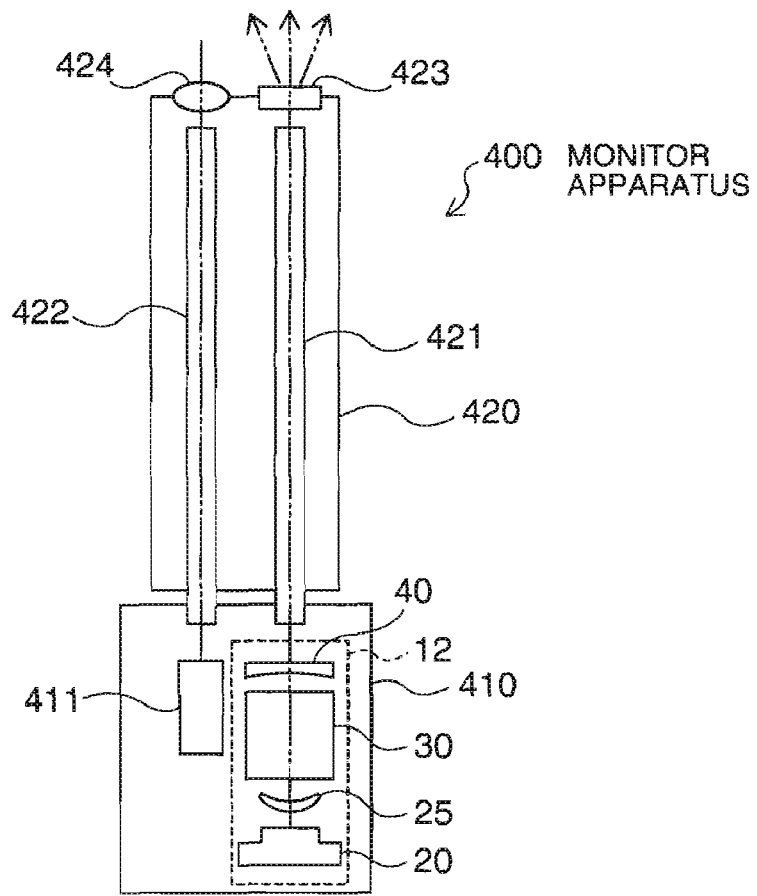
FIG. 9 is a schematic diagram of a monitor 400 according to a second embodiment of the invention.

A second embodiment of the invention is explained below. FIG. 9 is a schematic diagram of a monitor 400 according to a second embodiment of the invention. The monitor 400 includes an apparatus main body 410 and an optical transmission unit 420. The apparatus main body 410 includes the laser light source device 12 according to the first embodiment. The laser light source device 12 includes, as explained in the first embodiment, the semiconductor laser array 20, the cylindrical lens 25, the optical wavelength conversion element 30, and the reflection mirror 40.

The optical transmission unit 420 includes two light guides 421 and 422 on a light transmitting side and a light receiving side. Each of the light guides 421 and 422 is obtained by binding a large number of optical fibers and can transmit a laser beam to a far distance. The laser light source device 12 is disposed on an incidence side of the light guide 421 on the light transmitting side and a diffuser 423 is disposed on an emission side of thereof. A laser beam emitted from the laser light source device 12 is transmitted to the diffuser 423 provided at the end of the optical transmission unit 420 through the light guide 421 and is diffused by the diffuser 423 to illuminate a subject.

A focusing lens 424 is also provided at the end of the optical transmission unit 420. Reflected light from the subject can be received by the focusing lens 424. The reflected light received by the focusing lens 424 is transmitted to a camera 411 serving as an imaging unit provided in the apparatus main body 410 through the light guide 422 on the light receiving side. As a result, it is possible to image, with the camera 411, an image based on reflected light obtained when the subject is illuminated by the laser beam emitted from the laser light source device 12.

In the monitor 400 constituted as described above, the subject can be illuminated by the laser light source device 12 having high power. Therefore, it is possible to increase brightness of an image imaged by the camera 411.

As a modification of the second embodiment, the laser light source device 12 included in the apparatus main body 410 can be replaced with those in the first to third modifications of the first embodiment.

3. Third Embodiment

Figure 10:
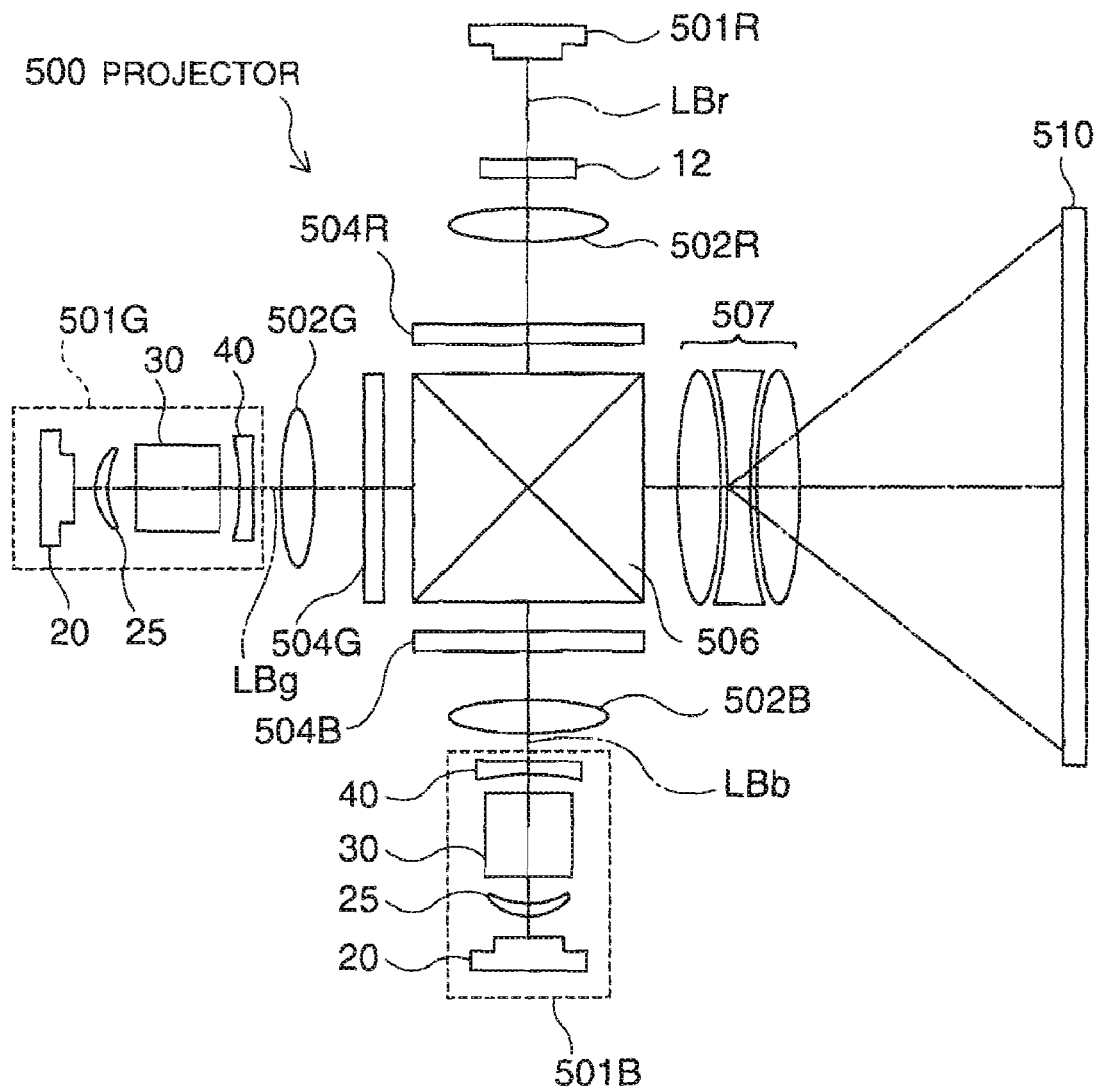
FIG. 10 is a schematic diagram of a projector 500 according to a third embodiment of the invention.

A third embodiment of the invention is explained below. FIG. 10 is a schematic diagram of a projector 500 according to a third embodiment of the invention. In the figure, a housing constituting the projector 500 is omitted for simplification of illustration. The projector 500 includes a red laser light source device 501R that emits red light, a green laser light source device 501G that emits green light, and a blue laser light source device 501B that emits blue light.

The red laser light source device 501R is a general semiconductor laser array that emits a red laser beam LBb. The green laser light source device 501G has a structure identical with that of the laser light source device 12 according to the first embodiment and includes the semiconductor laser array 20, the cylindrical lens 25, the optical wavelength conversion element 30, and the reflection mirror 40. The optical wavelength conversion element 30 performs wavelength conversion to emit a laser beam LBg of a wavelength of green. The blue laser light source device 501B has a structure identical with that of the laser light source device 12 according to the first embodiment and includes the semiconductor laser array 20, the cylindrical lens 25, the optical wavelength conversion element 30, and the reflection mirror 40. The optical wavelength conversion element 30 performs wavelength conversion to emit a laser beam LBb of a wavelength of blue.

The projector 500 includes liquid crystal light bulbs (light modulating unit) 504R, 504G, and 504B that modulate laser beams LBr, LBg, and LBb of the respective colors emitted from the laser light source devices 501R, 501G, and 501B of the respective colors according to an image signal transmitted from a personal computer or the like, a cross dichroic prism (color light combining unit) 506 that combines lights emitted from the liquid crystal light bulbs 504R, 504G, and 504B and leads the combined light to a projection lens 507, and a projection lens (projecting unit) 507 that enlarges an image formed by the light bulbs 504R, 504G, and 504B and projects the image on a screen 510.

The projector 500 further includes uniformalization optical systems 502R, 502G, and 502B further on a downstream side on an optical path than the respective laser light source devices 501R, 501G, and 501B in order to uniformalize illuminance distributions of laser beams emitted from the respective laser light source devices 501R, 501G, and 501B. The projector 500 illuminates the liquid crystal bulbs 504R, 504G, and 504B with lights, the illuminance distributions of which are uniformalized by the uniformalization optical systems. For example, the uniformalization optical systems 502R, 502G, and 502B include holograms and field lenses.

Three color lights modulated by the respective liquid crystal light bulbs 504R, 504G, and 504B are made incident on the cross dichroic prism 506. This prism is formed by bonding four rectangular prisms. A dielectric multi-layer film that reflects red light and a dielectric multi-layer film that reflects blue light are arranged in a cross shape on an inner surface of the prism. The three color lights are combined by these dielectric multi-layer films and light representing a color image is formed. The combined light is projected on the screen 510 by the projection lens 507 serving as a projection optical system and an enlarged image is displayed.

In the projector 500 according to this embodiment, the liquid crystal light bulbs 504R, 504G, and 504B, the cross dichroic prism 506, and the projection lens 507 constitute an image forming apparatus. An image corresponding to an image signal can be displayed on the screen 510 serving as a display surface by the image forming apparatus using lights of the laser light source devices 501R, 501G, and 501B of the respective colors.

In the projector 500 constituted as described above, it is possible to use the laser light source devices 501G and 501B having high power. Therefore, it is possible to display a high-intensity image.

As a modification of the third embodiment, the green laser light source device 501G and/or the blue laser light source device 501B can be changed to the laser light source devices according to the first to third modifications of the first embodiment.

4. Other Embodiments

The invention is not limited to the embodiments and the modifications described above. It is possible to carry out the invention in various forms without departing from the spirit of the invention.

(1) In the first embodiment, the semiconductor laser array 20 in which the plural light-emitting layers are arrayed is used as a laser light source. However, instead of the semiconductor laser array 20, a single laser light source including only one light-emitting layer may be used.

(2) In the embodiments and the modifications, the laser array of the VCSEL type is used as a laser array. However, instead of the laser array, a laser array of an edge-emitting type in which a resonating direction of light is parallel to a substrate surface may be used. Instead of the semiconductor laser, the laser light source can be lasers of other types such as a solid state laser, a liquid laser, a gas laser, and a free electron laser. In a high-power semiconductor laser, a laser light beam density of an active layer is a factor that accelerates deterioration in a laser element. However, it is possible to realize highly efficient wavelength conversion and extension of durable life by using the optical lens system after securing a wide light-emitting area.

(3) In the embodiments and the modifications, a laser light source device is the laser light source device of a so-called external resonator type that uses the reflection mirror on the outside of the semiconductor laser array. However, instead of the laser light source device, a laser light source of an internal resonator type may be used.

Figure 11:
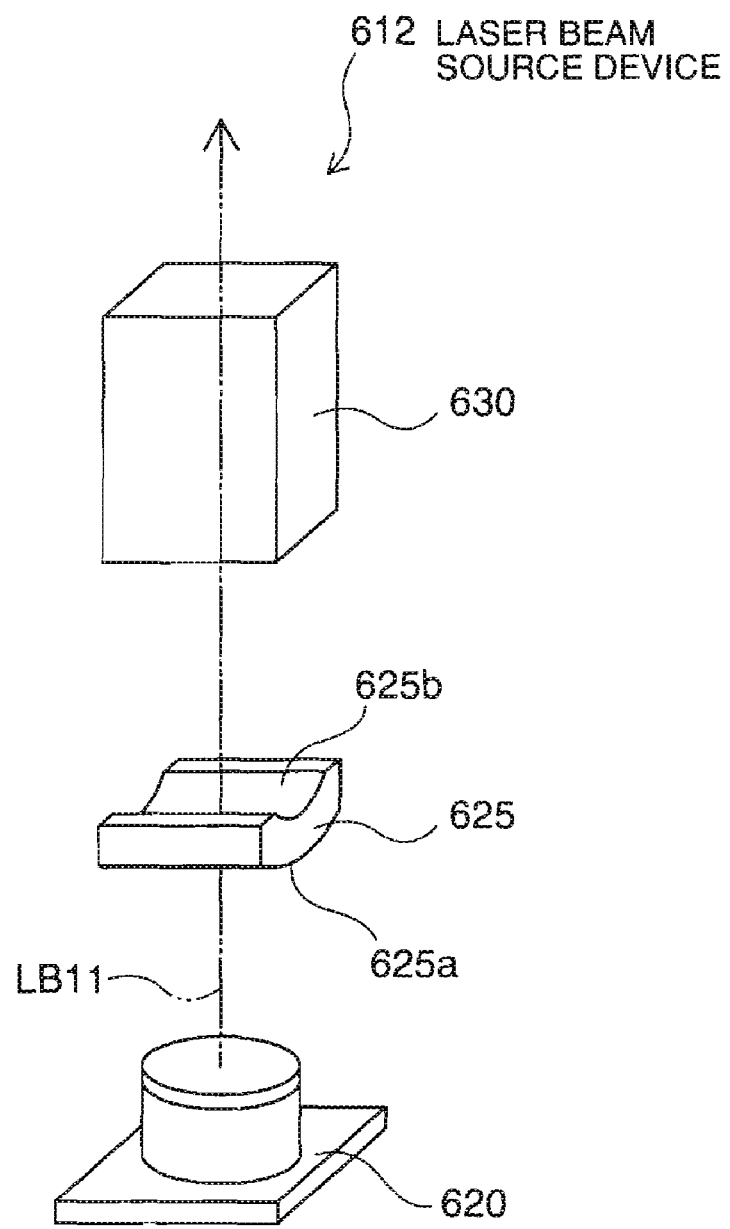
FIG. 11 is an explanatory diagram showing a laser light source device 612 according to another embodiment of the invention.

FIG. 11 is an explanatory diagram showing a laser light source device 612 according to an embodiment described in (3) above. The laser light source device 612 can be used as an illumination apparatus as in the first embodiment. As shown in the figure, the laser light source device 612 includes a semiconductor laser device 620, a cylindrical lens 625 of the meniscus shape, and an optical wavelength conversion element 630. The cylindrical lens 625 and the optical wavelength conversion element 630 are identical with the cylindrical lens 25 and the optical wavelength conversion element 30 in the first embodiment except that sizes are different. The cylindrical lens 625 has the meniscus shape, one side of which is a convex surface 625a having positive power and the opposite surface is a concave surface 625b having negative power.

The semiconductor laser device 620 is a laser light source of a so-called internal resonator type. In this embodiment, the semiconductor laser device 620 emits a single laser beam LB11. The laser beam LB11 is made incident on the optical wavelength conversion element 630 via the cylindrical lens 625, subjected to wavelength conversion by the optical wavelength conversion element 630, and emitted to the outside of the laser light source device 612.

In the laser light source device 612 constituted as described above, the laser beam LB11 from the semiconductor laser device 620 serving as the laser light source of the internal resonator type is condensed by the positive power of the convex surface 625a of the cylindrical lens 625 and a focal length is extended by the negative power of the concave surface 625b. Therefore, as in the first embodiment, it is possible to improve conversion efficiency in the optical wavelength conversion element 630. As a result, there is an effect that it is possible to generate a laser beam at high power. The laser light source device 612 can be used in a monitor, a projector, and the like other than the illumination apparatus.

(4) In the embodiments and the modifications, a focal length is extended by the second surface having the negative power included in the optical lens system. However, "a focal length is extended" also includes a case in which light emitted by the second surface is changed to complete parallel light. This can be realized by optical design of the "optical lens system" in the invention. For example, in the first embodiment, this can be realized by optical design of the convex surface 25a and the concave surface 25b of the cylindrical lens 25. In particular, since the cylindrical lens 25 has a function of condensing light on the convex surface 25a and extending a focal length on the concave surface 25b, it is possible to set the focal length to a desired length according to design. In other words, it is possible to secure a light beam area having a high energy density. In a state in which light is condensed by the convex surface 25a and an energy density is set high by design, even if a parallel light beam does not have a focal point on the concave surface 25b or a light beam gradually expands and does not have a focal point, high efficient conversion in the SHG is also possible in a high energy density state, which is the problem to be solved by the invention.

(5) In the embodiments and the modifications, the focus position of the optical lens system in the invention is present in the optical wavelength conversion element or at a further distance than the optical Iwavelength conversion element. However, the focus position does not always have to be present in such a position. The invention does not prevent the focus position from being present closer than the optical wavelength conversion element.

(6) In the embodiments and the modifications, the optical lens system in the invention is realized in the various structures. However, the optical lens system does not have to be limited to the structures in the embodiments and the modifications. The optical lens system may be constituted by an optical element or a combination of any plural optical elements as long as the optical lens system includes a first surface having positive power and a second surface having negative power in order from the laser light source side.

(7) In the embodiments, the optical wavelength conversion element 30 is the SHG element through which the polarization inversion area P1 pierces in the depth direction. However, instead of the SHG element, an SHG element of an optical waveguide type in which an optical waveguide is provided on a substrate may be used.

(8) The projector 500 according to the third embodiment is a liquid crystal projector of a so-called three plate system. However, instead of the liquid crystal projector, the projector 500 may be a liquid crystal projector of a single plate system that makes it possible to perform color display only with one light bulb by lighting a laser light source device in a time division manner for each color.

(9) The projector 500 according to the third embodiment is a liquid crystal projector including liquid crystal light bulbs. However, instead of the liquid crystal projector, the projector 500 may be a projector of a scan type including an image forming apparatus that displays an image corresponding to an image signal on a display surface by scanning a laser beam from the laser light source device on a screen.

The entire disclosure of Japanese Patent Application Nos. 2006-266965, filed Sep. 29, 2006, and 2007-192288, filed Jul. 24, 2007 are expressly incorporated by reference herein.

What is claimed is:

1. A laser light source device comprising:
   a laser light source that emits a plurality of laser beams as fundamental waves;
   an optical wavelength conversion element that converts the fundamental waves into second harmonics, the optical wavelength conversion element having a polarization inversion structure; and
   an optical lens system including a plurality of lenses, each lens having a first surface having positive power and a second surface having negative power, the optical lens system being arranged between the laser light source and the optical wavelength conversion element, the first surfaces and the second surfaces of each of the lenses arranged in order from the laser light source side, the lenses each being immediately adjacent to the optical wavelength conversion element and having an overall convex characteristic such that light exiting the second surface of the optical lens system converges faster than light entering the first surface of the optical lens system; and
   a mirror that transmits the second harmonic and reflects excitation light, the wavelength conversion element and the mirror arranged in order from the laser light source side,
   wherein the first surfaces have a first curvature and the second surfaces have a second curvature, the first curvature being larger than the second curvature, and
   each lens of the optical lens system corresponds to a single one of the plurality of laser beams.

2. The laser light source device according to claim 1, wherein the laser light source is a laser array in which plural light-emitting sections that emit light are arrayed.

3. The laser light source device according to claim 2, wherein the laser array is a surface-emitting laser array in which a resonating direction of light is perpendicular to a substrate surface.

4. The laser light source device according to claim 1, wherein the lenses are each optical elements of a meniscus shape, one side of which is formed in a convex surface as the first surface and an opposite side of which is formed in a concave surface as the second surface.

5. The laser light source device according to claim 4, wherein the optical elements of the meniscus shape are cylindrical lenses.

6. The laser light source device according to claim 4, wherein a focus position of the optical elements is present in the optical wavelength conversion element or at a further distance than the optical wavelength conversion element.

7. The laser light source device according to claim 1, wherein the lenses each include:
   a convex surface as the first surface; and
   a concave surface as the second surface.

8. An illumination apparatus comprising the laser light source device according to claim 1.

9. A monitor comprising:
   the laser light source device according to claim 1; and
   an imaging unit that images a subject that is illuminated by the laser light source device.

10. A projector comprising:
    the laser light source device according to claim 1; and
    an image forming apparatus that displays an image corresponding to an image signal on a display surface using light from the laser light source device.

11. The laser light source device of claim 1, the mirror having a reflection surface that opposes the optical wavelength conversion element, the reflection surface having a shape corresponding to an angle of incidence of the laser beams emitted from the optical wavelength conversion element.

12. The laser light source device of claim 1, the optical wavelength conversion element having a heat generating means and a thermistor that control a temperature of the optical wavelength conversion element.

13. The laser light source device of claim 1, wherein the optical lens system receives the laser beams emitted from the laser light source having circular cross sections and condenses the laser beams such that the laser beams have elliptical cross sections.

14. A laser light source device comprising:
a laser light source that emits a plurality of laser beams as fundamental waves,
an optical wavelength conversion element that converts the fundamental waves into second harmonics, the optical wavelength conversion element having a polarization invertion structure; and
an optical lens system including a plurality of lenses, each having a first surface having positive power and a second surface having negative power, the optical lens system being arranged between the laser light source and the optical wavelength conversion element, the first surfaces and the second surfaces of each of the lenses arranged in order from the laser light source side, the lenses each being immediately adjacent to the optical wavelength conversion element and having an overall convex characteristic such that the light exiting the second surface of the optical lens system converges at a faster rate than light entering the first surface of the optical lens system; and
a mirror that transmits the second harmonic and reflects excitation light, the wavelength conversion element and the mirror arranged in order from the laser light source side,
wherein the first surfaces have a first radius of curvature and the second surfaces have a second radius of curvature, the first radius of curvature being smaller than the second radius of curvature, and
each lens of the optical lens system corresponds to a single one of the plurality of laser beams.

15. The laser light source device according to claim 1, the polarization inversion structure being defined by a plurality of polarization inversion areas alternately arranged with a plurality of non-inversion areas, the polarization inversion areas being areas in which a direction of spontaneous polarization inherent in a ferrodielectric optical crystal is inverted and the polarization non-inversion areas being areas in which the direction of spontaneous polarization in the ferrodielectric optical crystal is not inverted.

16. A laser light source device according to claim 14, the polarization inversion structure being defined by a plurality of polarization inversion areas alternately arranged with a plurality of non-inversion areas, the polarization inversion areas being areas in which a direction of spontaneous polarization inherent in a ferrodielectric optical crystal is inverted and the polarization non-inversion areas being areas in which the direction of spontaneous polarization in the ferrodielectric optical crystal is not inverted.

* * * * *